(12) United States Patent
Agraffeil (10) Patent No.: US 9,496,348 B2
(45) Date of Patent: Nov. 15, 2016

(54) METHOD FOR DOPING A GAN-BASE SEMICONDUCTOR

(71) Applicant: COMMISSARIAT Á L'ENERGIE ATOMIQUE ET AUX ENERGIES ALTERNATIVES, Paris (FR)

(72) Inventor: Claire Agraffeil, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 14/855,761

(22) Filed: Sep. 16, 2015

(65) Prior Publication Data

US 2016/0093698 A1 Mar. 31, 2016

(30) Foreign Application Priority Data

Sep. 26, 2014 (FR) .................... 14 59130

(51) Int. Cl.
| | |
|---|---|
| *H01L 29/20* | (2006.01) |
| *H01L 21/26* | (2006.01) |
| *H01L 21/32* | (2006.01) |
| *H01L 21/31* | (2006.01) |
| *H01L 21/265* | (2006.01) |
| *H01L 21/324* | (2006.01) |
| *H01L 21/311* | (2006.01) |

(52) U.S. Cl.
CPC ..... *H01L 29/2003* (2013.01); *H01L 21/26546* (2013.01); *H01L 21/31105* (2013.01); *H01L 21/324* (2013.01); *H01L 21/3245* (2013.01)

(58) Field of Classification Search
CPC ........... H01L 21/2251; H01L 21/2253; H01L 21/2254; H01L 21/2255; H01L 21/2256; H01L 29/2003; H01L 33/0075
See application file for complete search history.

(56) References Cited

U.S. PATENT DOCUMENTS

| | | |
|---|---|---|
| 5,306,662 A | 4/1994 | Nakamura et al. |
| 5,766,695 A | 6/1998 | Nguyen et al. |
| 2006/0286784 A1 | 12/2006 | Usov et al. |
| 2007/0134834 A1* | 6/2007 | Lee .............. H01L 33/007 438/46 |

(Continued)

FOREIGN PATENT DOCUMENTS

WO 82/01619 A1 5/1982

OTHER PUBLICATIONS

Cayrel, F. et al. "Si implanted in GaN grown on sapphire using AlN and oxide cap layers," Nuclear Instruments & Methods in Physics Research, Section—B/Beam Interactions With Materials and Atoms, vol. 272, pp. 137-140, 2012.

(Continued)

*Primary Examiner* — Karen Kusumakar
(74) *Attorney, Agent, or Firm* — Oliff PLC (57) ABSTRACT

The method for doping a GaN-base semiconductor to fabricate a p-n junction includes a first step consisting in providing a substrate including a GaN-base semiconductor material layer covered by a silicon-base mask. The method includes a second step of performing implantation of impurities in the mask so as to transfer additional dopant impurities of Si type by diffusion from the mask to the semiconductor material layer to form an n-type area adjacent to a p-type area. Configured heat treatment is then performed to activate the dopant impurities and the additional dopant impurities.

14 Claims, 4 Drawing Sheets

(56) References Cited

U.S. PATENT DOCUMENTS

| | | |
|---|---|---|
| 2007/0269968 A1 | 11/2007 | Saxler et al. |
| 2010/0133656 A1 | 6/2010 | Hager, IV et al. |
| 2010/0147835 A1 | 6/2010 | Mulpuri et al. |
| 2010/0171126 A1 | 7/2010 | Briere |
| 2012/0068188 A1 | 3/2012 | Feigelson et al. |
| 2013/0056793 A1 | 3/2013 | Srinivasan |
| 2016/0061528 A1 | 3/2016 | Derenge |

OTHER PUBLICATIONS

Lorenz, K et al. "High-temperature anealing and optical activation of Eu-implanted GaN," Applied Physics Letters, American Institute of Physics, vol. 85, No. 14, pp. 2712-2714, 2004.

Hager, C. E. et al. "Activation of ion implanted Si in GaN using a dual AlN annealing cap," J. Appl. Phys., vol. 105, pp. 033713-1 to 033713-7, 2009.

Miranda, S. M. C. et al, "Sequential multiple-step europium ion implantation and annealing of GaN," Physica Status Solidi (C), vol. 11, No. 2, pp. 253-257, 2014.

Chan, J. S. et al, "Thermal Annealing Characteristics of Si and Mg-implanted GaN thin films," Applied Physics Letters, American Institute of Physics, vol. 68, No. 19, pp. 2702-2704, 1996.

Nogales, E. et al, "Failure Mechanism of AlN nanocaps used to protect rare earth-implanted GaN during high temperature annealing," Applied Physics Letters, American Institute of Physics, vol. 88, No. 3, pp. 031902-1 to 031902-3, 2006.

Porowski, et al, "Annealing of GaN Under High Pressure of Nitrogen," Journal of Physics: Condensed Matter, vol. 14, pp. 11097-11110, 2002.

Feigelson, et al, "Multicycle Rapid Thermal Annealing Technique and its Application for the Electrical Activation of Mg Implanted in GaN," Journal of Crystal Growth, vol. 350, pp. 21-26, 2012.

Aluri, et al, "Microwave Annealing of Mg-implanted and in situ Be-doped GaN," Journal of Applied Physics, American Institute of Physics, vol. 108, No. 8, pp. 083103-1 to 083103-7, 2010.

Hwang, et al, "Enhancing P-Type Conductivity in Mg-Doped GaN Using Oxygen and Nitrogen Plasma Activation," Japanese Journal of Applied Physics, Japan Society of Applied Physics, vol. 44, No. 4A, pp. 1726-1729, 2005.

Kim, et al, "Reactivation of Mg Acceptor in Mg-doped GaN by Nitrogen Plasma Treatment," Applied Physics Letters, American Institute of Physics, vol. 76, No. 21, pp. 3079-3081, 2000.

Shintani, et al, "Etching of GaN Using Phosphoric Acid," Journal of the Electrochemical Society, vol. 123, No. 5, pp. 706-713, 1976.

Gupta, "Plasma Immersion Ion Implantation (PIII) Process-Physics and Technology," International Journal of Advancements in Technology, vol. 2, No. 4, pp. 471-490, 2011.

Wu, et al, "Positive and Negative Effects of Oxygen in Thermal Annealing of p-type GaN," Semiconductor Science Technology, vol. 27, 085017, pp. 1-3, 2012.

Nomoto, et al, "Remarkable Reduction of On-Resistance by Ion Implantation in GaN/AlGaN/GaN HEMTs with Low Gate Leakage Current," IEEE Electron Device Letters, IEEE Service Center, vol. 28, No. 11, pp. 939-941, 2007.

International Business Machines Corp., "Three-Dimensional Semiconductor Device Structures Using Channeled Ion Implantation and Annealing Techniques," IBM Technical Disclosure Bulletin, vol. 32, No. 4A, pp. 358-359, 1989.

Whelan, et al, "The Dependence of the Radiation Damage Formation on the Substrate Implant Temperature in GaN during Mg ion implantation," Journal of Applied Physics, American Institute of Physics, vol. 98, No. 1, pp. 013515-1 to 013515-5, 2005.

International Business Machines Corp., "Forming of Low Resistance Ohmic Contacts to III-V Semiconductors," IBM Technical Disclosure Bulletin, vol. 32, No. 7, pp. 141-142, 1989.

Anonymous, "Barrier Height Enhancement by Recoil Implantation," Research Disclosure, Mason Publications, No. 292, pp. 932, 1988, XP000104853, ISSN:0374-4353.

Cao, et al, "Implanted p-n junctions in GaN," Solid State Electronics, vol. 43, pp. 1235-1238, 1999.

Baharin, et al, "Experimental and Numerical Investigation of the Electrical Characteristics of Vertical n-p Junction Diodes Created by Si Implantation into p-GaN," Institute of Electrical and Electronics Engineers, pp. 12-15, 2008.

U.S. Appl. No. 14/849,237, filed Sep. 9, 2015 in the name of Agraffeil.

U.S. Appl. No. 14/846,376, filed Sep. 4, 2015 in the name of Agraffeil.

U.S. Appl. No. 14/859,860, filed Sep. 21, 2015 in the name of Agraffeil.

Feb. 25, 2016 Office Action issued in U.S. Appl. No. 14/849,237.
Mar. 24, 2016 Office Action issued in U.S. Appl. No. 14/859,860.
Apr. 20, 2016 Office Action Issued in U.S. Appl. No. 14/846,376.

* cited by examiner

METHOD FOR DOPING A GAN-BASE SEMICONDUCTOR

BACKGROUND OF THE INVENTION

The invention relates to method for performing ion implantation and activation of dopant impurities in a GaN-base semiconductor.

STATE OF THE ART

Ion implantation is commonly used to dope semiconductors. To fabricate p-n junctions, masks are generally used to select the areas of the semiconductor that have to be implanted and the areas to be protected. The implantation step is then performed using ions generally produced from a gaseous or solid source (source used for Mg for example), which impact the semiconductor after they have been accelerated, for example, with an energy comprised between 10 and 500 keV.

The nature of the implanted ions is chosen according to the type of doping that is desired to be obtained. $Mg^+$ ions are for example used to perform p-doping (excess holes) in GaN-base semiconductors, whereas $Si^+$ ions are often used to perform n-doping (excess electrons) of the same type of semiconductor. The semiconductor then undergoes heat treatment in order to activate the dopant impurities more or less efficiently.

The document "Implanted p-n junctions in GaN" (X. A. Cao et al., Solid-state Electronics, 43 (1999) 1235-1238) describes a method for performing implantation of $Si^+$ ions in a GaN semiconductor doped by $Mg^+$ ions in order to obtain a $n^+$/p-doped semiconductor. Here the $Si^+$ ions are implanted in areas selected by means of a mask deposited on the semiconductor. The mask is removed after implantation, and a layer of AlN is then deposited by cathode sputtering on the semiconductor in order to protect the latter when heat treatment is performed for activation of the dopants.

The document "Experimental and numerical investigation of the electrical characteristics of vertical n-p junction diodes created by Si implantation into p-GaN" (A. Baharin, Institute of Electrical and Electronics Engineers, 978-1-4244-2717-8/08, (2008)) describes a fabrication method of vertical p-n junctions from GaN semiconductors p/p+-doped by means of type $Mg^+$ ions. Here, $Si^+$ ions are implanted by means of ion beams of different energies to control the implantation depth in the semiconductor.

OBJECT OF THE INVENTION

One object of the invention is to provide an alternative to the methods of the prior art in order to dope a semiconductor, in particular for the purpose of fabricating p-n junctions.

This problem tends to be solved by means of a method which comprises the following steps:
providing a substrate comprising a GaN-base semiconductor material layer covered by a silicon-base mask,
implanting impurities in the mask so as to transfer dopant impurities of Si type by diffusion from the mask to the GaN-base semiconductor material layer to form an n-type area adjacent to a p-type area,
performing thermal annealing configured to activate the dopant impurities and the additional dopant impurities.

According to one feature of the invention, the mask can partially cover the substrate so as to define an area covered by the mask and an uncovered area.

Implantation can be performed with p-type dopants, and their mean implantation depth can be situated in the mask. It can be arranged at a distance at least equal to 300 nm from the interface so as to incorporate additional dopant impurities in the semiconductor material layer.

The method can also comprise a deposition step of a protective cap layer performed before the thermal annealing step. The material of the cap layer can be chosen from silicon oxide, or silicon nitride of $Si_xN_y$ type, amorphous silicon, and compounds of $HfSi_xO_y$ type, and preferably from aluminium oxide and aluminium nitride.

Deposition of the cap layer is performed before the heat treatment step, and can for example be performed after the implantation step of the dopant impurities and of the additional dopant impurities, directly on the mask, or after the latter has been removed. In alternative manner, it can be envisaged to deposit the cap layer before implantation of the dopant impurities in the case where the cap layer is not silicon-base. After the heat treatment, the cap layer can advantageously be removed.

In preferred manner, the implantation step can be performed at a temperature comprised between 15 and 700° C., preferably between 450 and 600° C.

Furthermore, the heat treatment step can advantageously comprise a combination of at least two anneals of different durations and temperatures. At least one of the anneals can furthermore be performed at a temperature of more than 1000° C.

As far as the mask is concerned, the latter can advantageously have a thickness comprised between 2 and 400 nm. The thickness of the semiconductor material layer can for its part be comprised between 5 nm and 10 μm, preferentially between 500 nm and 10 μm, and ideally equal to 1 μm.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 1:
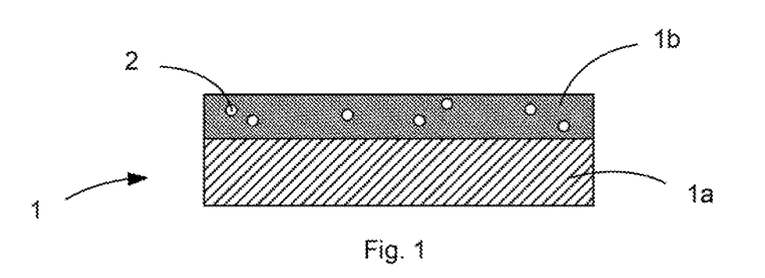
FIGS. 1 to 10 illustrate in schematic manner an implementation mode of the method for doping a GaN-base semiconductor.

According to a first embodiment of the doping method represented in FIGS. 1 to 10, it is first of all necessary to provide a substrate 1 such as the one represented in FIG. 1. The latter comprises a support 1a for example made from silicon or from sapphire, $Al_2O_3$, SiC, and a GaN-base semiconductor material layer 1b. As an alternative, substrate 1 can be made from bulk GaN.

When substrate 1 is a bulk GaN block, it is possible to cover the back surface with cap layers advantageously identical to those deposited on substrate 1 on the front surface and which will be described in the following. The front surface of substrate 1 is defined here as being the surface impacted by the beam of dopant impurities, and the back surface as being the surface opposite the front surface.

Fabrication of substrate 1 advantageously comprises a first cleaning step of support 1a, such as for example RCA cleaning if support 1a is made from silicon. Semiconductor material layer 1b is then fabricated by epitaxial growth directly on support 1a. The material of support 1a has to be chosen carefully to have similar lattice parameters to those of semiconductor material layer 1b in order for the latter to grow in coherent manner.

To improve the quality of semiconductor material layer 1b, an AlGaN-base intermediate layer with a thickness of at least 1 μm may be deposited on support 1a before epitaxial growth of layer 1b (embodiment not represented). For example, for a support 1a made from sapphire, GaN-base semiconductor material layer 1b can be deposited directly on support 1a if the latter is made from sapphire. On the other hand, if the support is made from silicon, it is judicious to deposit an AlGaN-base buffer layer.

When fabrication of semiconductor material layer 1b has been terminated, the latter can advantageously have a thickness comprised between 5 nm and 10 μm, preferentially between 500 nm and 10 μm, ideally equal to 1 μm.

According to an advantageous embodiment, GaN-base semiconductor material 1b is not initially doped or is not intentionally initially doped. This makes it possible to simultaneously perform a p-doping and an n-doping during the ion implantation step, as will be seen further on, and to form a layer 1b able to form complementary circuits with devices using excess electrons and devices using excess holes.

In alternative manner, it is possible to use a p-doped semiconductor material layer 1b. In this embodiment, dopant impurities 2 can for example be Mg+ ions, inserted directly when epitaxial growth is performed (cf. FIG. 1).

Figure 2:
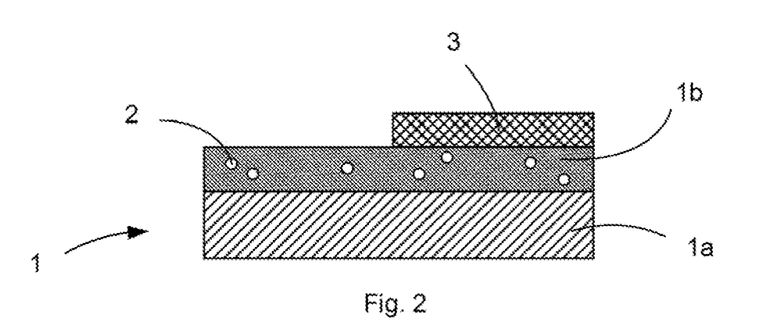

In the second step of the embodiment, a mask 3 configured to totally or partially cover the surface of semiconductor material layer 1b is fabricated. This step of the method as represented in FIG. 2. As illustrated, mask 3 can partially cover substrate 1 so as to define a covered area and an uncovered area. This mask 3 can for example be made by photolithography or electronic lithography. Its thickness is advantageously comprised between 2 and 400 nm.

The material of mask 3 is silicon-base, preferentially silicon oxide and/or silicon nitride, amorphous silicon, or $HfSiO_2$. It therefore comprises Si atoms able to diffuse into substrate 1 when they are provided with the necessary energy. This property enables Si atoms to be implanted in semiconductor material layer 1b thereby enabling a local n-doping to be achieved.

Figure 3:
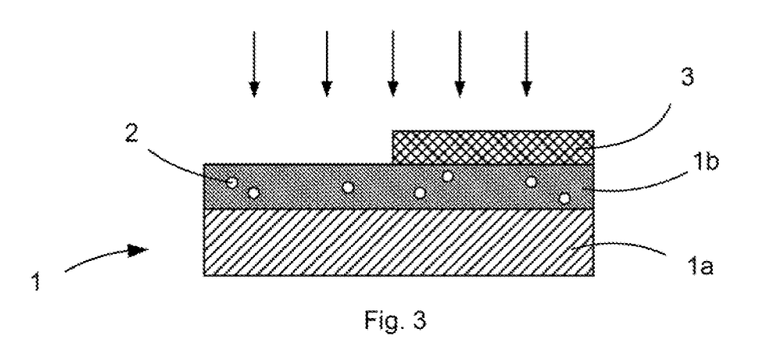

In a third step of the embodiment, implantation of dopants 2 applied on mask 3 and on the uncovered area of substrate 1 is performed (cf. FIG. 3). Dopants 2 can be p-type, for example $Mg^+$ ions, n-type such as for example $Si^+$ ions, or non electrically active dopants such as $N^+$ ions. The presence of mask 3 prevents any damage to semiconductor material layer 1b when implantation of dopants 2 is performed.

In conventional manner, the implantation conditions are imposed both by the technical performances of the implantation equipment and by the concentration and location of dopant impurities 2 to be implanted in semiconductor material layer 1b.

For example, for a $Mg^+$ ion beam having a fluence of $2.10^{15}$ atoms/cm$^2$ and an energy of 200 keV, dopant impurities 2 can be implanted in a GaN layer up to a depth of about 400 nm with a concentration peak estimated at 160-180 nm. This depth is also called mean implantation depth or $R_p$.

The implantation energy of dopants 2 can be chosen so that, in the areas covered by mask 3, the mean implantation depth $R_p$ is located: (i) in mask 3 close to the interface with semiconductor material layer 1b, or (ii) in semiconductor material layer 1b close to the interface with mask 3, or (iii) in depth in semiconductor material layer 1b.

Whatever the implantation energy that is chosen, the latter is sufficient for the implanted dopants 2 to provide the necessary energy to the Si atoms present in mask 3 to diffuse into semiconductor material layer 1b.

When dopants 2 are p-type dopants, the areas that are not covered by mask 3 are directly p-doped, whereas in the areas covered by the mask, the p-type dopants provide the Si atoms with the necessary energy for the latter to diffuse. On completion of ion implantation, semiconductor material layer 1b comprises uncovered areas containing p-type dopant impurities 2, and covered areas containing both p-type dopant impurities 2 and additional n-type dopant impurities 4, the residual doping in this area finally being an n-type doping (cf. FIG. 4).

Figure 4:
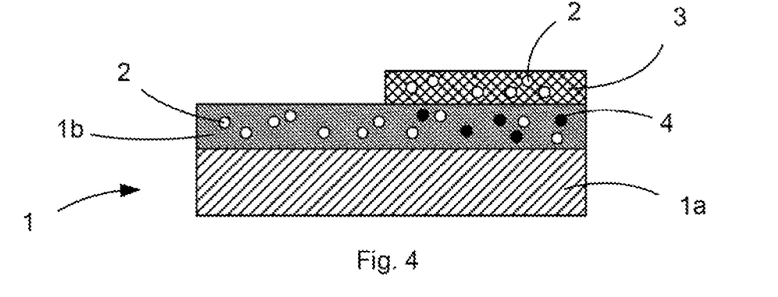

In the case of p-type dopants 2, it may be advantageous to choose the implantation energy such that the mean implantation depth is located at the interface between mask 3 and semiconductor material layer 1b, or in close proximity to this interface, either in mask 3 or in semiconductor material layer 1b. After implantation, the p-type dopant impurities 2 and additional n-type dopant impurities 4 are then located in the area called active area of semiconductor 1b, i.e. the depth used for example for fabricating junctions or transistors. The active area of semiconductor 1b extends for example up to a depth of 100 or 300 nm.

Performing an Si implantation through mask 3 presents the advantage of causing less damage to the surface of semiconductor material layer 1b in comparison with a conventional Si implantation.

When the maximum implantation is located in mask 3 or at the interface between mask 3 and semiconductor layer 1b, the energy provided by dopants 2 is sufficient to enable incorporation of the Si atoms from mask 3 to the active area of semiconductor material 1b. When the maximum implantation is located in depth in semiconductor layer 1b, the energy provided by the n-type dopants enables the Si atoms to diffuse into layer 1b in a deeper area.

Performing implantation of non electrically active dopants can be useful to fabricate a semiconductor material layer 1b that is n-doped in the areas of semiconductor 1b covered by mask 3, and not doped elsewhere. As for n-type or p-type implantations, the implantation energy is chosen such as to enable diffusion of Si atoms more or less in depth in semiconductor matrix 1b. The use of non electrically active dopants can give rise to repair of vacancies created by diffusion of the Si atoms or already present in semiconductor material layer 1b.

According to one feature of the invention, it may be advantageous to control the temperature at which ion implantation is performed. In preferred manner, this implantation can be executed at a temperature comprised in a range between 15° C. and 700° C., advantageously between 200° C. and 600° C., and in preferred manner between 450° C. and 600° C. For this, a system enabling the back surface of support 1a to be heated, for example of Peltier effect module type, can advantageously be used.

Performing heating of the substrate during the ion implantation step enables both a better diffusion of the dopants in semiconductor material layer 1b and a better diffusion of the Si atoms from mask 3 to semiconductor material layer 1b.

According to a particular implementation of the method (not represented), mask 3 can be removed (take-off) after the ion implantation step before heat treatment of substrate 1 is performed. Take-off can for example be performed by wet etching by means of hydrofluoric acid (HF) if the mask is made from $SiO_2$ or phosphoric acid ($H_3PO_4$) if the mask is made from $SiN_x$ or AlN.

Advantageously, to activate dopant impurities 2 and additional dopant impurities 4, substrate 1 can be annealed at high temperature, for example more than 1000° C. However, above a temperature of about 850° C., semiconductor material layer 1b is considerably impaired and a part of the nitrogen evaporates.

Figure 5:
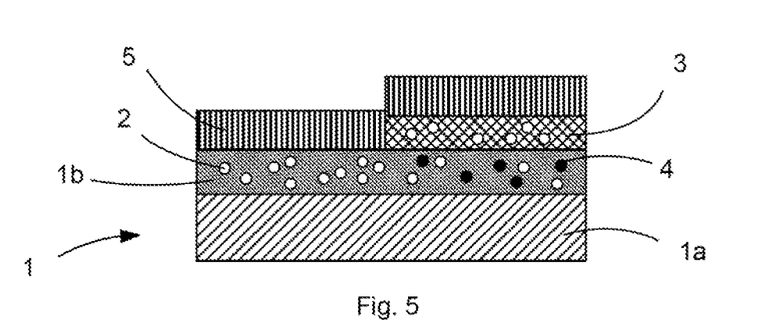

It is therefore advantageous to perform a deposition step of a cap layer 5 after the implantation step of dopant impurities 2 and of additional dopant impurities 4, and before performing the heat treatment. Cap layer 5 serves the purpose of greatly limiting damage of the surface of semiconductor layer 1b. This step of the method is represented in FIG. 5.

The material of cap layer 5 can be chosen from aluminium oxide, aluminium nitride, silicon nitride of $Si_xN_y$ type for silicon oxide, or compounds of $HfSi_xO_y$ type. The material of cap layer 5 is preferably aluminium nitride.

Deposition can for example be a Metalorganic Chemical Vapor Deposition (MOCVD) performed in identical equipment to that which was used for epitaxial growth of semiconductor material layer 1b. Deposition can also be performed by Low Pressure Chemical Vapor Deposition (LPCVD).

Depositing a cap layer 5 made from aluminium nitride AlN can be judicious as the lattice parameters of this material are very close to those of the gallium nitride-base semiconductor material, which enhances the adherence of cap layer 5 on substrate 1. It is also possible to replace the AlN by AlGaN, or by a stack of AlN and AlGaN layers. In this case, the AlGaN layer can comprise up to 50% of Ga, advantageously up to 20% of Ga, and preferably less than 5% of Ga.

According to a preferred embodiment, cap layer 5 can have a thickness comprised between 1 and 200 nm, and more precisely between 1 and 100 nm. This thickness is sufficient to create an efficient barrier in order to prevent evaporation's of the nitrogen molecules from semiconductor material layer 1b when heat treatment is performed.

Figure 6:
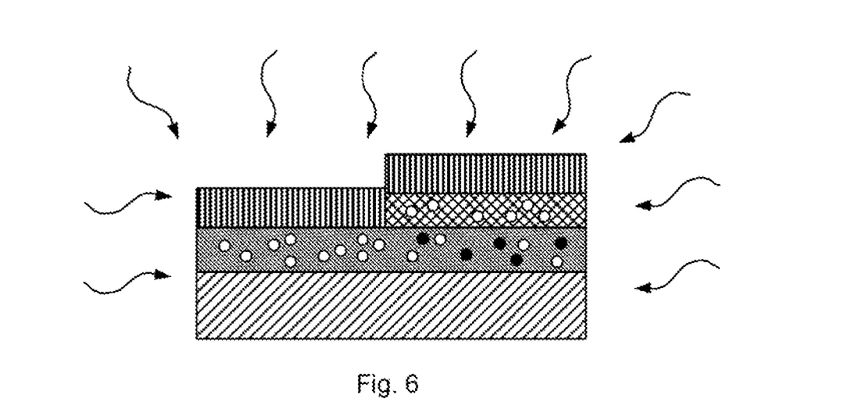

The heat treatment step schematically illustrated in FIG. 6 can comprise Rapid Thermal Annealing or Rapid Thermal Processing (RTP) for the activation ratio of dopant impurities 2 and of additional dopant impurities 4 to be high without the surface of semiconductor layer 1b being damaged.

Standard Furnace Annealing can also be performed to enable an efficient diffusion of dopant impurities 2 and of additional dopant impurities 4 into semiconductor layer 1b in substitutional position.

When performing the heat treatment step, it is therefore possible to perform a standard annealing, rapid annealing, or any combination of rapid and standard annealings depending on the result that is desired to be obtained. At least one of the anneals can advantageously be performed at a temperature of more than 1000° C. to obtain a high activation ratio of dopant impurities 2 and of additional dopant impurities 4.

For illustrative purposes, standard furnace annealing at a temperature comprised between 850 and 1250° C. can be performed for a duration ranging from a few minutes to a few hours. Rapid annealing can also be performed in a temperature range of 850 to 1250° C., or even up to 1600° C. if support 1a is made from sapphire. In this case, the duration of the rapid annealing is comprised between a few seconds and a few minutes. Advantageously, the annealing or annealings can be performed in a controlled atmosphere containing a gas advantageously chosen from $N_2$, Ar, He, $NF_3$, $O_2$, or a mixture of $N_2/O_2$, $N_2/H_2$, $Ar/H_2$.

The inventors observed that heat treatment enables diffusion of the Si-type dopants in the direction of semiconductor material layer 1b to be enhanced. For example, for an annealing performed 1100° C., the concentration of n-type dopant impurities 4 is the larger the longer the heat treatment period.

Furthermore, the heat treatment enables dopant impurities 2 and additional dopant impurities 4 to be activated. Knowing that the atomic radius of silicon atoms is 1.17 Å, that that of gallium atoms is 1.26 Å, and that that of magnesium atoms is 1.36 Å, it is advanced that silicon atoms place themselves more easily in a substitutional position in semiconductor material layer 1b than magnesium atoms. Consequently, the activation ratio of the Si-type impurities is higher than the activation ratio of the Mg-type impurities in the area covered by mask 3 (cf. FIG. 7).

Figure 7:
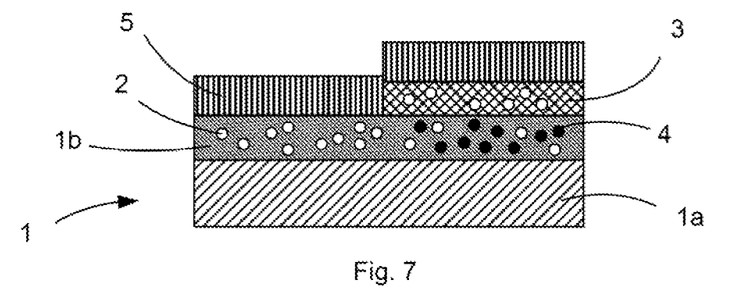

The inventors observed that the activation ratio of the n-type dopants (Si impurities) can reach 100%, whereas the activation ratio of the p-type dopants (Mg impurities) is comprised between 5 and 30%.

Figure 8:
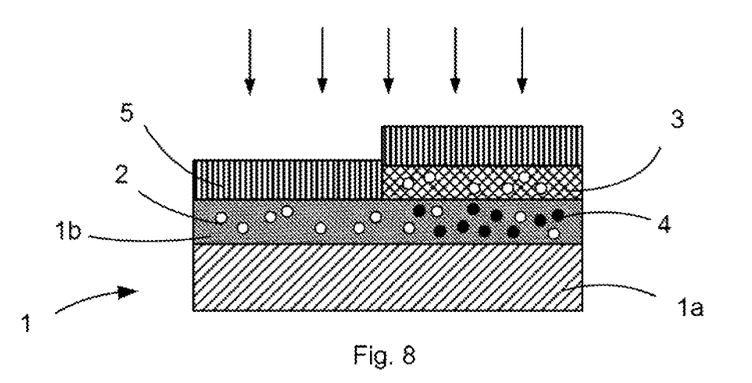
Figure 9:
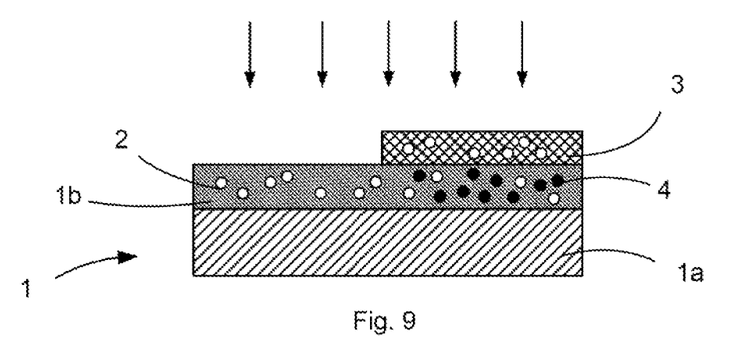

Subsequent to the heat treatment, mask 3 and cap layer 5 can be removed (cf. FIGS. 8 and 9). It is possible for example to use wet etching by means of phosphoric acid for the cap layer if the latter is made from AlN or SiNx, and by means of hydrofluoric acid to perform take-off of mask 3 if it is made from SiOx or SiNx. In alternative manner, take-off of cap layer 5 can be performed by Chemical Mechanical Planarization (CMP), or any other suitable etching technique.

Figure 10:
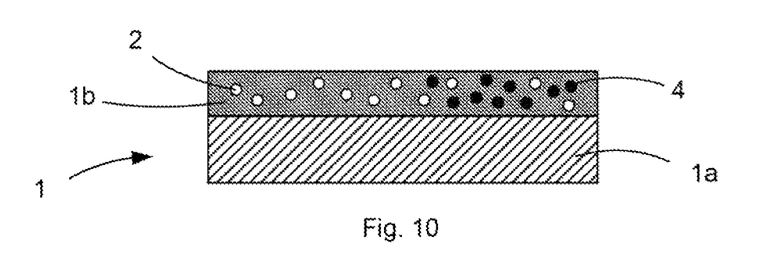

Implementation of the method therefore enables a substrate 1 to be fabricated comprising a semiconductor layer 1b that is p-doped in certain areas and n-doped in other areas (cf. FIG. 10). This method can therefore be used in fabrication of devices requiring p-n junctions, such as Schottky diodes, in Metal Semiconductor Field Effect Transistors (MESFET), or High Electron Mobility Transistors (HEMT).

According to an alternative embodiment that is not represented, it can be envisaged to perform take-off of mask 3 before depositing cap layer 5, before the thermal annealing step is performed. This does however limit the concentration of n-type dopants in semiconductor material layer 1b, as a large quantity of $Si^+$ ions diffuse during the thermal annealing.

According to a third implementation of the method, it can be envisaged to first of all deposit a cap layer 5 covering only certain areas of substrate 1. Mask 3 can then be deposited on other areas of the substrate covering cap layer 5 not. The thicknesses of cap layer 5 and of mask 3 are judiciously chosen so as to correctly protect substrate 1. In this way, when the implantation step is performed, the following takes place:
  implantation of dopant impurities 2 in the uncovered areas of substrate 1,
  implantation of dopant impurities 2 and of additional dopant impurities 4 in the areas of substrate 1 only covered by mask 3,
  no implantation in the areas of substrate 1 covered by cap layer 5.

This implementation of the method advantageously enables p-i-n junctions to be achieved in simple and efficient manner.

Finally, in a fourth embodiment, it is possible to perform the heat treatment step without having previously deposited a cap layer 5. This can be envisaged if the heat treatment is performed by means of standard furnace annealings performed at temperatures of less than 1000° C., i.e. temperatures where little damage is caused to the substrate 1. If the heat treatment is performed by means of rapid annealings, it is possible to increase to a temperature of about 1100° C. for a few seconds.

To form a p-doped area adjacent to an n-doped area in a GaN-base semiconductor, different implementations of the method that has been described in the foregoing can be envisaged.

GaN-base material layer 1b can be initially p-doped. In this case, the dopant impurities 2 can be electrically neutral or be p-type dopants. The implantation energy is chosen according to the thickness of mask 3 so that the mean implantation depth of the dopants is located in mask 3. The role of the dopant impurities is then simply to push the Si atoms from mask 3 into semiconductor layer 1b. The Si atoms act as additional dopant impurities 4. In the areas that are not covered by mask 3, the conductivity type is not modified by the implantation. On the other hand, in the areas covered by mask 3, the conductivity type of semiconductor 1b after heat treatment is advantageously n-type to form a horizontal p-n junction.

If semiconductor layer 1b is initially p-doped, dopant impurities 2 can also be n-type dopants. In this case, mask 3 advantageously covers the whole of substrate 1. Certain areas of mask 3 have a higher stopping capacity than other adjacent areas of mask 3. In this way, in the areas where the stopping capacity is high, the dopants do not manage to pass through mask 3 and semiconductor layer 1b remains p-doped. In the areas where the stopping capacity of mask 3 is low, the dopants are able to pass through mask 3, and semiconductor layer 1b can be n-doped. One way of adjusting the stopping capacity of the mask in certain areas is to vary the thickness of mask 3. In the areas where p-doping is desired, the thickness of mask 3 is sufficiently large to stop dopant impurities 2 and to push the Si atoms over a thickness such that they are stopped before they reached the interface between mask 3 and semiconductor material layer 1b. In this way, implantation of the n-type dopants does not modify the type of conductivity of GaN-base layer in the areas where p-doping is required. In the areas where it is desired to have n-doping, mask 3 has a small thickness, and the implantation energy is chosen so as to push the Si atoms from mask 3 into semiconductor material layer 1b.

If semiconductor material layer 1b is not initially doped, then the dopant impurities 2 are advantageously p-type dopants, for example $Mg^+$ ions. Substrate 1 is only covered by mask 3 in the areas where n-type doping is desired. As for the other embodiments which have been presented, the implantation energy of the dopant impurities is chosen according to the thickness of mask 3 so that the mean implantation depth of dopant impurities 2 is located in mask 3. When implantation is performed, dopant impurities 2 push the Si atoms from mask 3 into semiconductor layer 1b in the areas covered by the mask, whereas in the areas that are not covered, the p-type dopants are implanted directly in semiconductor layer 1b. The heat treatment then enables the dopants to be activated and the n area to be placed at an equivalent depth to that of the p area in order to obtain the horizontal p-n junction.

To achieve better control of the implantation depth of dopant impurities 2 and of additional dopant impurities 4 in semiconductor material layer 1b, a cap layer 5 can be deposited before implantation. This thickness enables the concentration profile of the n and p activated dopants to be locally controlled so as to obtain an n-doped area adjacent to a p-doped area, i.e. a horizontal p-n junction. The material of cap layer 5 can for example be AlN.

The table below presents two sets of parameters for which a horizontal p-n junction can be obtained in a GaN-base semiconductor layer 1b when the dopants are Mg atoms and a cap layer 5 made from AlN or AlGaN is deposited before the implantation step of dopant impurities 2 is performed.

|  | Case no 1 | Case no 2 |
| --- | --- | --- |
| Mask thickness [nm] | 5-10 | 50-100 |
| Concentration of Si atoms at a depth $R_p$ [at/cm$^3$] | $10^{20}$-$10^{21}$ | $5.10^{18}$-$5.10^{19}$ |
| Cap layer thickness [nm] | 30-150 | 150-250 |
| Diffusion depth of the Si atoms in the GaN [nm] | 30-150 | 150-250 |
| Implantation depth of the Mg atoms in the GaN [nm] | 30-150 | 150-250 |
| Implantation energy of the Mg atoms [keV] | 30-100 | 100-250 |

The thicknesses of mask 3 and of cap layer 5 are chosen according to the implantation depth of the Mg atoms and the diffusion depth of the Si atoms in semiconductor layer 1b. The implantation energy of the Mg atoms is determined such that the mean implantation depth is located in mask 3, in proximity to the interface with substrate 1.

These sets of parameters are naturally not exhaustive. Other sets of parameters enable equivalent results to be obtained, i.e. creation of an n-doped area adjacent to a p-doped area.

The invention claimed is:

1. A method for doping a semiconductor GaN-base to fabricate a p-n junction, comprising the following steps:
   providing a substrate comprising a GaN-base semiconductor material layer covered by a silicon-base mask,
   implanting dopant impurities in the mask so as to transfer additional dopant impurities of Si type by diffusion from the mask to the GaN-base semiconductor material layer to form an n-type area adjacent to a p-type area,
   performing thermal annealing configured to activate the dopant impurities and the additional dopant impurities.

2. The method for doping a semiconductor according to claim 1, wherein the mask partially covers the substrate so as to define an area covered by the mask and an uncovered area.

3. The method for doping a semiconductor according to claim 1, wherein the dopant impurities are of p-type.

4. The method for doping a semiconductor according to claim 1, wherein the mean implantation depth of the dopant impurities is located at a distance at least equal to 300 nm from the interface between the mask and the semiconductor material layer so as to incorporate additional dopant impurities in the semiconductor material layer.

5. The method for doping a semiconductor according to claim 1, comprising a deposition step of a cap layer performed before the heat treatment step.

6. The method for doping a semiconductor according to claim 5, wherein the deposition step of the cap layer is performed before the implantation step of the dopant impurities.

7. The method for doping a semiconductor according to claim 5, wherein deposition of the cap layer is performed after the implantation step of the dopant impurities and of the additional dopant impurities.

8. The method for doping a semiconductor according to claim 5, wherein the material of the cap layer is chosen from aluminium oxide, aluminium nitride, silicon oxide, or silicon nitride of $Si_xN_y$ type, amorphous silicon and compounds of $HfSi_xO_y$ type.

9. The method for doping a semiconductor according to claim 5, comprising a take-off step of the cap layer by etching after the heat treatment.

10. The method for doping a semiconductor according to claim 1, wherein the implantation step is performed at a temperature comprised between 15 and 700° C.

11. The method for doping a semiconductor according to claim 1, wherein the heat treatment step is a combination of at least two anneals of different durations and temperatures.

12. The method for doping a semiconductor according to claim 11, wherein at least one of the anneals is performed at a temperature of more 1000° C.

13. The method for doping a semiconductor according to claim 1, wherein the thickness of the mask is comprised between 2 and 400 nm.

14. The method for doping a semiconductor according to claim 1, wherein the thickness of the semiconductor material layer is comprised between 5 nm and 10 µm.

* * * * *